United States Patent [19]
Terasawa

[11] 3,914,783
[45] Oct. 21, 1975

[54] MULTI-LAYER SEMICONDUCTOR DEVICE

[75] Inventor: Yoshio Terasawa, Hitachi, Japan

[73] Assignee: Hitachi, Ltd., Japan

[22] Filed: Dec. 3, 1973

[21] Appl. No.: 421,322

Related U.S. Application Data

[63] Continuation of Ser. No. 293,096, Sept. 28, 1972, abandoned.

[30] Foreign Application Priority Data

Oct. 1, 1971 Japan .............................. 46-76361

[52] U.S. Cl. ...................... 357/38; 357/20; 357/47; 357/51; 357/55; 357/68

[51] Int. Cl.$^2$ ........................................ H01L 29/74

[58] Field of Search... 317/235 AA, 235 AB, 235 R, 317/235 AJ; 357/20, 37, 38, 47, 51, 55, 68

[56] References Cited

UNITED STATES PATENTS

| | | | |
|---|---|---|---|
| 3,360,696 | 12/1967 | Neilson et al. | 317/235 |
| 3,372,318 | 3/1968 | Tefft | 317/235 |
| 3,408,545 | 10/1968 | De Cecco et al. | 317/235 |
| 3,428,874 | 2/1969 | Gerlach | 317/235 |
| 3,476,989 | 11/1969 | Miles et al. | 317/235 |
| 3,489,962 | 1/1970 | McIntyre et al. | 317/235 |
| 3,579,060 | 5/1971 | Davis | 317/235 R |
| 3,700,982 | 10/1972 | Weinstein | 317/235 R |
| 3,731,162 | 5/1973 | Suenaga et al. | 317/235 R |

FOREIGN PATENTS OR APPLICATIONS

| | | | |
|---|---|---|---|
| 44-20662 | 9/1969 | Japan | 317/235 |

*Primary Examiner*—Andrew J. James
*Assistant Examiner*—Joseph E. Clawson, Jr.
*Attorney, Agent, or Firm*—Craig & Antonelli

[57] ABSTRACT

A multi-layer semiconductor device having at least three contiguous layers which are alternately different in conductivity type. In the device, one of the end layers among the three layers comprises a main region and an auxiliary region which are connected to each other by a resistive element.

7 Claims, 10 Drawing Figures

MULTI-LAYER SEMICONDUCTOR DEVICE

This is a continuation, of application Ser. No. 293,096 filed Sept. 28, 1972, now abandoned.

This invention relates to multi-layer semiconductor devices having switching characteristics.

One form of multi-layer semiconductor devices having a switching characteristic is composed of a semiconductor body consisting of four contiguous PNPN layers of alternately different conductivity type, a pair of main electrodes in low ohmic contact with the two outer layers respectively of the semiconductor body, and a control electrode provided if required.

Suppose that a forward voltage with a constant rate of rise is applied to such a multi-layer semiconductor device in the OFF-state. In this case, the forward voltage can be applied to the multi-layer semiconductor device without turning on the device until it reaches the maximum blocking voltage peculiar to the device when the rate of rise of the applied forward voltage (hereinafter defined as *dv/dt*) is low. However, with the increase in the *dv/dt*, an undesirable phenomenon may occur in which the multi-layer semiconductor device is prematurely turned on at an applied forward voltage lower than the maximum blocking voltage peculiar to the device. Such a phenomenon is objectionable in that the switching characteristic of the device is extremely adversely affected and the device is no longer applicable to control circuits due to the fact that the turn-on control of the device of, for example, four-layer or five-layer three-terminal (or four-terminal) construction by a control signal cannot be attained.

Therefore, when the *dv/dt* capability of the multi-layer semiconductor device is small, it is necessary to connect a capacitor between the main electrodes of the device for decreasing the rate of rise of the forward voltage applied across the main electrodes so that the device may not be turned on even with a high *dv/dt*. In this case, the smaller the *dv/dt* capability, the capacitor must have a correspondingly larger capacitance, resulting in the defect that the size of the device becomes large. Thus, the *dv/dt* capability must be as large as possible.

A known four-layer three-terminal semiconductor device or thyristor is shown in FIG. 1 as an example of prior art devices having a large *dv/dt* capability. This device comprises a semiconductor body 111 of four-layer structure consisting of alternately arranged layers of $P_E$, $N_B$, $P_B$ and $N_E$ of different conductivity type. The layer $N_B$ is an N-type base layer. The layers $P_E$ and $P_B$ are a P-type emitter layer and a P-type base layer, respectively, which are disposed on opposite sides of the N-type base layer $N_B$ so as to form a first and a second PN junction $J_1$ and $J_2$ between them and the N-type base layer $N_B$. The layer $N_E$ is an N-type emitter layer which is embedded in the P-type base layer $P_B$ and has the surface thereof exposed so as to form a third PN junction $J_3$ between it and the P-type base layer $P_B$. An anode 112 and a cathode 113 are in low ohmic contact with the surface of the P-type emitter layer $P_E$ and N-type emitter layer $N_E$ respectively. A control electrode 114 is provided on the surface of the P-type base layer $P_B$, and a resistor 115 is connected between the cathode 113 and the control electrode 114.

When, in the thyristor having such a structure, a voltage providing a positive potential at the anode 112 relative to the cathode 113, that is, a forward voltage for the thyristor is applied across the anode 112 and cathode 113 and its value is gradually increased, the second PN junction $J_2$ is reverse biased and the width of the depletion layers on opposite sides of this PN junction $J_2$ is increased thereby producing a displacement current. This displacement current increases in proportion to the increase in *dv/dt*. Further, with the increase in the forward voltage, the reverse current flowing through the second PN junction $J_2$ increases too. The displacement current and reverse current act to bias the third PN junction $J_3$ in the forward direction thereby inducing injection of carriers. The rate at which the third PN junction $J_3$ is forward biased is greater in the peripheral portions of the N-type emitter layer $N_E$ due to the concentrated supply of the displacement current and reverse current from the area of the P-type base layer $P_B$ which does not overlap the N-type emitter layer $N_E$ when viewed in the stacked direction of the layers. Consequently, the high *dv/dt* causes turn-on at the peripheral portions of the N-type emitter layer $N_E$ resulting in mal-operation of the device.

The connection of the resistor 115 between the cathode 113 and the control electrode 114 in the prior art device is effective in suppressing the mal-operation of the device to some extent due to the fact that the displacement current and reverse current flowing in the vicinity of the control electrode 114 are led toward the cathode 113 through the control electrode 114 and resistor 115 thereby decreasing the rate at which the third PN junction $J_3$ is forward biased. In this case, the smaller the resistance of the resistor 115, the greater amount of the displacement current and reverse current flows into the cathode 113 through the resistor 115 and the greater effect of suppressing the maloperation of the device can be attained. However, the provision of the resistor 115 having a small resistance is defective in that a large control signal current is required for turning on the device since the control signal current passes through the resistor 115 too.

In the multi-layer semiconductor device of the kind above described, not only the high rate of rise of the applied forward voltage but also a high rate of temperature rise causes the undesirable phenomenon in which the device is prematurely turned on at a voltage lower than the maximum blocking voltage peculiar to the device. This arises from the fact that the temperature rise of the device causes an increase in the reverse leakage current at the second PN junction $J_2$ and this current acts in the same manner as the displacement current which appears when the voltage build-up rate *dv/dt* is high. Therefore, an effort to obtain a multi-layer semiconductor device which is not adversely affected by the temperature rise leads inevitably to a structure similar to that of the prior art device, and this is undesirable.

In a thyristor having high breakdown voltage, it is common practice to employ a so-called bevelled structure in which the side faces of a semiconductor body at which the PN junctions are exposed to the outside are inclined with respect to the plane of the PN junctions so as to improve the breakdown voltage along the junction surface. However, the bevelled structure results in a further increase in the adverse effect due to the high *dv/dt* and high rate of temperature rise above described.

It is therefore an object of the present invention to provide a multi-layer semiconductor device having a novel end layer structure.

Another object of the present invention is to provide a multi-layer semiconductor device having a large *dv/dt* capability.

A further object of the present invention is to provide a multi-layer semiconductor device which can operate stably against temperature variations.

Another object of the present invention is to provide a multi-layer semiconductor device having a large capability to withstand a steep inrush current slope *di/dt* appearing when the device is turned on.

Other objects, features and advantages of the present invention will be apparent from the following detailed description of preferred embodiments thereof taken in conjunction with the accompanying drawings, in which.

Figure 1:
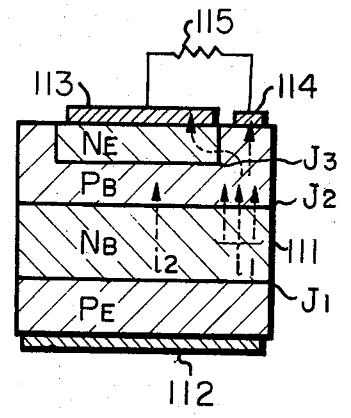
FIG. 1 PRIOR ART
FIG. 1 is a schematic sectional view of a prior art multi-layer semiconductor device.

Turn-on of a multi-layer semiconductor device occurs when the density of current flowing into the end layer acting as the emitter exceeds a predetermined value. The present invention is based on the finding that division of the end emitter layer into a plurality of portions at the area where the current density is high can reduce the density of current flowing into the individual end layer portions. Preferred embodiments of the present invention will now be described in detail with reference to the drawing.

Figure 2:
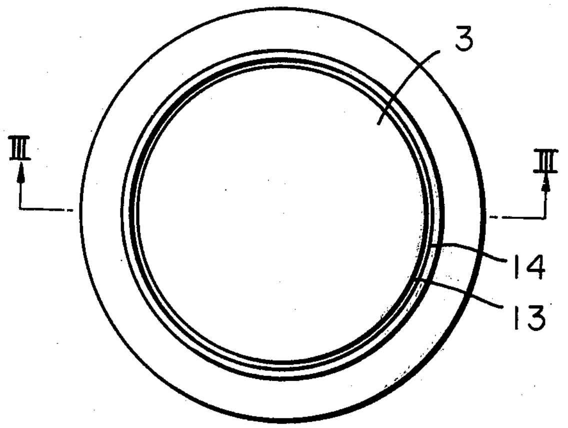
FIG. 2 is a schematic plan view of a multi-layer semiconductor device embodying one form of the present invention.
Figure 3:
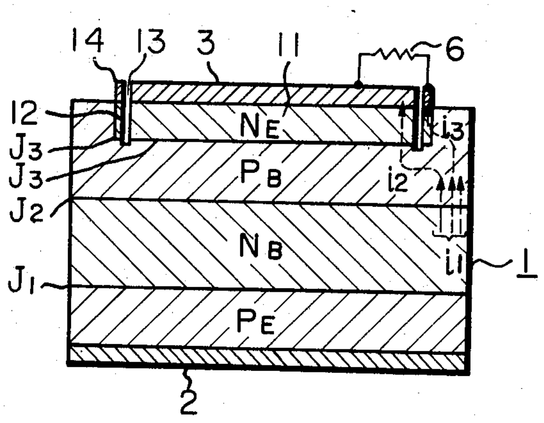
FIG. 3 is a schematic sectional view taken on the line III—III in FIG. 2.

Referring first to FIGS. 2 and 3, a semiconductor body 1 comprises an N-type emitter layer $N_E$, a P-type base layer $P_B$, an N-type base layer $N_B$ and a P-type emitter layer $P_E$. A first PN junction $J_1$ is formed between the P-type emitter layer $P_E$ and the N-type base layer $N_B$. A second PN junction $J_2$ is formed between the N-type base layer $N_B$ and the P-type base layer $P_B$, and a third PN junction $J_3$ is formed between the P-type base layer $P_B$ and the N-type emitter layer $N_E$. An anode 2 and a cathode 3 are in low ohmic contact with the P-type emitter layer $P_E$ and the N-type emitter layer $N_E$ respectively. The N-type emitter layer $N_E$ comprises a main region 11 which is in the form of a disk and is in contact with the cathode 3, and an auxiliary region 12 which is isolated from the main region 11 by a groove 13 extending to the P-type base layer $P_B$ and is not in contact with the cathode 3. The auxiliary region 12 is annular in shape and surrounds the main region 11. The auxiliary region 12 is provided with a conductor 14 on the surface thereof. A resistive element 6 is connected between the cathode 3 and the conductor 14 provided on the auxiliary region 12.

With such a structure, it is possible to improve the *dv/dt* capability. More precisely, the current $i_1$ including the displacement current and reverse current appearing in the peripheral portions of the second PN junction $J_2$ is divided into a current component $i_2$ flowing into the main region 11 and a current component $i_3$ flowing into the auxiliary region 12. Thus, the density of current flowing into the N-type emitter layer $N_E$ can be reduced compared with that before the N-type emitter layer $N_E$ is divided into the main region 11 and the auxiliary region 12, so that the device can be substantially prevented from being turned on by the displacement current and reverse current.

It is most desirable that the resistance value of resistive element 6 is selected so that the density of displacement current and reverse current in the peripheral portions of the main region 11 is substantially equal to that in the auxiliary region 12. However, the resistance of the resistive element 6 used in the present invention may not necessarily be set at the value which gives the above relation between the current densities in the peripheral portions of the main region 11 and in the auxiliary region 12, and the resistive element 6 may have any suitable resistance value provided that it is connected between the main region 11 and the auxiliary region 12. This will be readily understood by reference to FIG. 4 from which it will be seen that mere connection of the resistive element 6 between the main region 11 and the auxiliary region 12 can greatly improve the *dv/dt* capability compared with the case in which these regions are short-circuited or not connected to each other.

Figure 4:
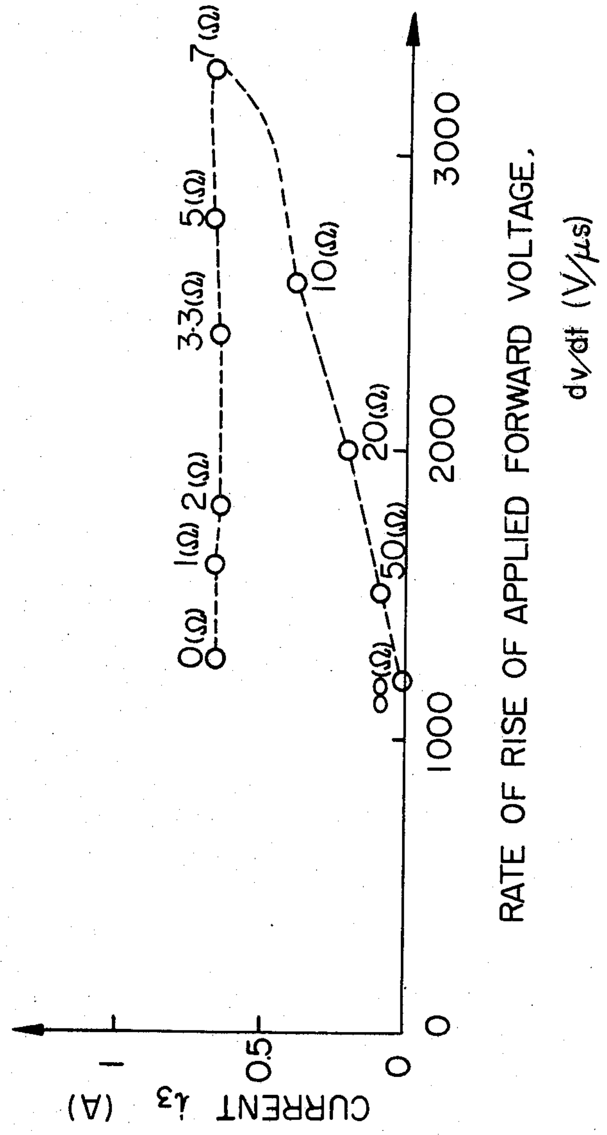
FIG. 4 is a graphic representation of the relation between the *dv/dt* capability and the value of current flowing into an auxiliary ragion in which the resistance of a resistive element shown in FIG. 2 is taken as a parameter.

FIG. 4 shows the relation between the critical *dv/dt* for turning on the device shown in FIGS. 2 and 3 and the value of current $i_3$ flowing into the auxiliary region 12 when the resistance value of the resistive element 6 is taken as a parameter. It will be seen from FIG. 4 that the device can only withstand the forward *dv/dt* of the order of 1200 volts per $\mu s$ in the case in which the N-type emitter layer $N_E$ is divided into the main region 11 and the auxiliary region 12 and these regions are short-circuited to each other (this being equivalent to the case in which the N-type emitter layer $N_E$ is not divided into such regions) and in the case in which these regions 11 and 12 are not connected to each other and the resistance value is infinitely large, whereas the device can withstand the *dv/dt* of 1200 volts per $\mu s$ to 3300 volts per $\mu s$ when the resistance of the resistive element 6 is varied to various values. Thus, the connection of the resistive element 6 of whatever resistance value between the main and auxiliary regions 11 and 12 can improve the *dv/dt* capability over that before the division of the N-type emitter layer $N_E$ into the main and auxiliary regions 11 and 12.

While the resistive element 6 in the form of an external resistor is connected between the main and auxiliary regions 11 and 12 in FIGS. 2 and 3, a portion of the N-type emitter layer $N_E$ may be left non-removed during the formation of the groove 13 in the semiconductor body 1 to attain the same effect as that above described. When such an N-type region is left in a portion of the groove 13, the resistance value of this portion may be determined by reference to FIG. 4 and on the basis of the required *dv/dt* capability.

Figure 5:
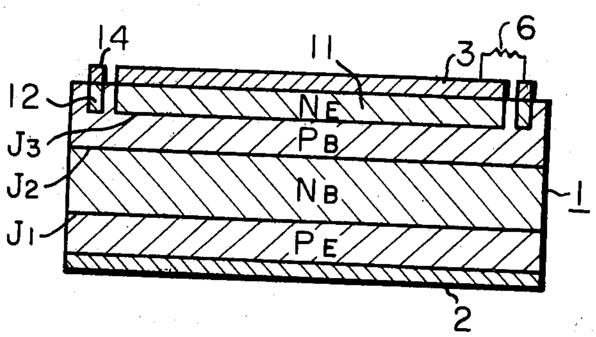
FIG. 5 is a schematic sectional view of a modification of the device shown in FIGS. 2 and 3.

FIG. 5 shows a modification of the multi-layer semiconductor device shown in FIGS. 2 and 3. While the N-type emitter layer $N_E$ is divided into the main and auxiliary regions 11 and 12 by the groove 13 in FIGS. 2 and 3, these regions 11 and 12 are isolated from each other by a portion of the P-type base layer $P_B$ in the modification shown in FIG. 5. Such a structure is preferable over that shown in FIGS. 2 and 3 from the viewpoint of manufacture although the device shown in FIG. 5 and the device shown in FIGS. 2 and 3 are the same in the effect of attaining the objects of the present invention. In manufacturing the device shown in FIGS. 2 and 3, it is necessary to remove the groove portion of the N-type emitter layer $N_E$ by etching after the formation of the N-type emitter layer $N_E$ and thus a troublesome step of etching is inevitably required. In contrast, in the case of the device shown in FIG. 5, the N-type emitter layer $N_E$ can be easily and precisely divided into the main and auxiliary regions 11 and 12 by masking portion of the P-type base layer $P_B$ corresponding to the unnecessary portion of the N-type emitter layer $N_E$ and applying a so-called selective diffusion technique during the formation of the N-type emitter layer $N_E$.

Figure 6:
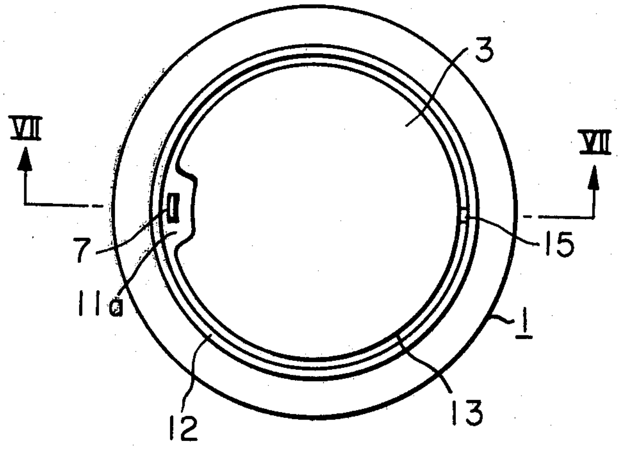
FIG. 6 is a schematic plan view of another embodiment showing an application of the present invention to a thyristor.
Figure 7:
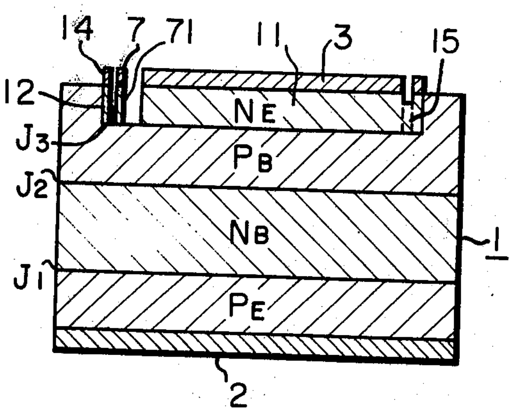
FIG. 7 is a schematic sectional view taken on the line VII—VII in FIG. 6.

In another embodiment shown in FIGS. 6 and 7, the present invention is applied to a thyristor, and like reference numerals are used therein to denote like parts appearing in FIGS. 2 and 3. In the thyristor shown in FIGS. 6 and 7, an N-type emitter layer $N_E$ comprises a main region 11 substantially in the form of a disk and an annular auxiliary region 12 surrounding the main region 11. A peripheral portion of the main region 11 is cut as shown by 11*a*, and a control electrode 7 is deposited on an N-type region 71 above a P-type base layer $P_B$ at a position between the cutout portion 11*a* and the auxiliary region 12. The main region 11 is connected at a position remote from the control electrode 7 to the auxiliary region 12 by a small N-type region 15 which acts as a resistive element.

In the thyristor having such a structure, the *dv/dt* capability can be improved for the same reasons as those described with reference to the device shown in FIGS. 2 and 3. Further, due to the interposition of the control electrode 7 between the main and auxiliary regions 11 and 12, the portions of the main and auxiliary regions 11 and 12 adjacent to the control electrode 7 are initially turned on by the control signal current, and then the load current produced as a result of turnon of the auxiliary region 12 flows from the auxiliary region 12 into the main region 11 throughout the opposite areas of the main and auxiliary regions 11 and 12 thereby turning on the main region 11 at the entire circumference thereof. Thus, the capability to withstand a steep inrush current slope *di/dt* appearing during turn-on of the device can be improved. Further, due to the fact that the control electrode 7 is provided on the N-type region 71 above the P-type base layer $P_B$, the control signal current flows into the main region 11 from the control electrode 7 directly or through the auxiliary region 12 only when a high control signal voltage which will break down the PN junction formed between the N-type region 71 and the P-type base layer $P_B$ is applied between the control electrode 7 and the cathode 3. Therefore, the device can be prevented from turn-on due to noise voltage between the control electrode 7 and the cathode 3. While the resistive element 15 is formed as an integral part of the semiconductor body 1 in FIGS. 6 and 7, an external resistor may be used in lieu thereof so as to attain the same effect.

In FIGS. 6 and 7, the control electrode 7 is provided on the N-type region 71 above the P-type base layer $P_B$ in the space between the main region 11 and the auxiliary region 12. However, when the effect owing to the above arrangement, that is, the improvement in the *di/dt* rating or in the control signal voltage for the purpose of preventing unintentional turn-on is not expected, the control electrode 7 may be disposed outside of the auxiliary region 12 or may be deposited directly on the P-type base layer $P_B$. In this case too, the main region 11, auxiliary region 12 and N-type region 71 may be isolated from one another by portions of the P-type base layer $P_B$ as shown in FIG. 5.

Figure 8:
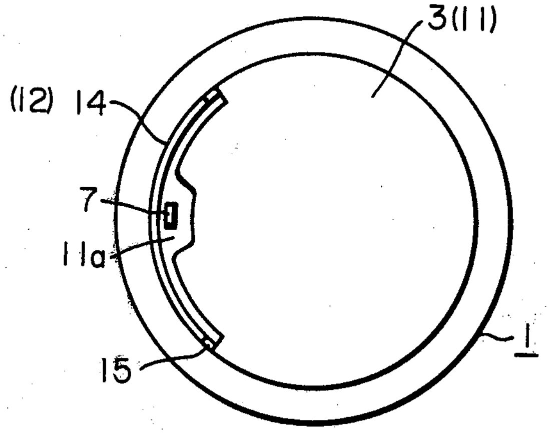
FIG. 8 is a schematic plan view of a further embodiment of the present invention.

In a further embodiment shown in FIG. 8, the present invention is applied to a thyristor, and like reference numerals are used to denote like parts appearing in FIGS. 6 and 7. In the thyristor shown in FIG. 8, an N-type emitter layer $N_E$ similar to that shown in FIG. 7 comprises a main region 11 substantially in the form of a disk and an arcuate auxiliary region 12 disposed opposite to the main region 11 on a portion of a P-type base layer $P_B$. A peripheral portion of the main region 11 is cut out as shown by 11*a*, and a control electrode 7 is disposed between the auxiliary region 12 and the cut-out portion 11*a* of the main region 11 as in FIGS. 6 and 7. The main region 11 is connected to the opposite ends of the auxiliary region 12 by a pair of small N-type regions 15.

When the operating frequency is relatively low and a large thyristor current capacity is required, the arcuate length of the auxiliary region 12 opposite to the main region 11 is generally shortened in order to increase the conduction area of the junction as shown in FIG. 8. Even in such a case, the current including the displacement current and reverse current increases in the portion of the main region 11 in the vicinity of the P-type base layer portion which is exposed for the provision of the auxiliary region 12 and control electrode 7, and an undesirable reduction in the *dv/dt* capability results. The connection of the main and auxiliary regions 11 and 12 with each other by the small N-type regions 15 having a predetermined lateral resistance is advantageous in that an undesirable reduction in the *dv/dt* capability can be effectively prevented as will be readily apparent from the description given hereinbefore.

Figure 9:
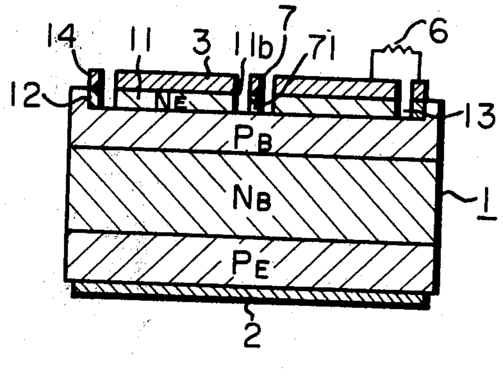

In another embodiment shown in FIG. 9, the present invention is applied to a center gate type of thyristor, and like reference numerals are used to denote like parts appearing in FIGS. 2 and 3. In the thyristor shown in FIG. 9, an N-type emitter layer $N_E$ comprises a main region 11 in the form of a disk having a central operating 11*b* for exposing a portion of a P-type base layer $P_B$ and an annular auxiliary region 12 surrounding the main region 11 through a groove 13 on the P-type base layer $P_B$. A central control electrode 7 is deposited on an N-type region 71 above the P-type base layer $P_B$ in the central opening 11*b*. A resistive element 6 connects the main region 11 with the auxiliary region 12.

In a thyristor having a high breakdown voltage, a so-called bevelled structure is generally employed in which the end faces of a semiconductor body at which the PN junctions are exposed to the outside are inclined with respect to the plane of the PN junctions. According to this structure, the cathode side area of the semiconductor body is very small compared with the anode side area thereof. Consequently, the displacement current and reverse current are concentrated in the peripheral portions of the N-type emitter layer thereby reducing the *dv/dt* capability in such portions. The structure shown in FIG. 9 is advantageous in that the undesirable reduction in the *dv/dt* capability in the peripheral portions of the N-type emitter layer can be satisfactorily prevented.

Figure 10:
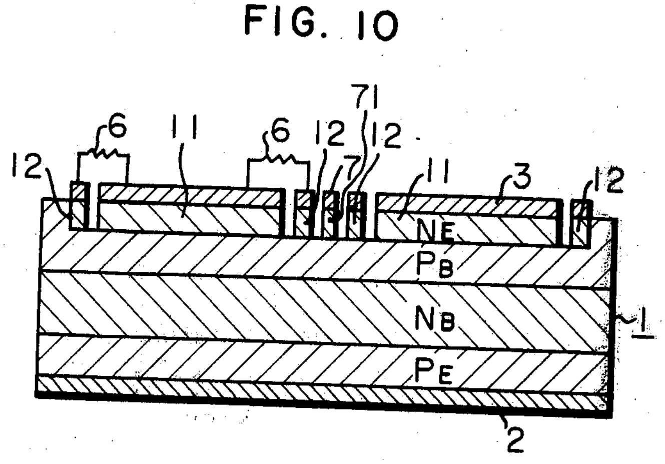
FIGS. 9 and 10 are schematic sectional views of other embodiments of the present invention.

FIG. 10 shows a modification of the thyristor structure shown in FIG. 9. In the thyristor shown in FIG. 10, another annular auxiliary region 12 surrounds the N-type region 71 on which the control electrode 7 is deposited. In the center gate type of thyristor, the same problem as occurs in the peripheral portions of the N-type emitter layer $N_E$ may arise in the central gate portion where a portion of the N-type emitter layer $N_E$ is removed for the disposition of the control electrode 7. Therefore, an arrangement as shown in FIG. 10 is preferred in the case of the center gate type of thyristor.

In the devices shown in FIGS. 8, 9 and 10 too, the main and auxiliary regions 11 and 12 as well as these regions and the region having the control electrode 7 disposed therein may be isolated from each other by portions of the P-type base layer $P_B$ in a manner as shown in FIG. 5.

The present invention has been described with reference to its application to four-layer two-terminal semiconductor devices and to four-layer three-terminal semiconductor devices. It is apparent however that the present invention is applicable also to five-layer two-terminal semiconductor devices and to five-layer three-terminal semiconductor devices.

What is claimed:

1. A multi-layer semiconductor device comprising a semiconductor body including therein four contiguous layers, adjacent ones of said layers having a conductivity type different from each other, and a pair of main electrodes in low ohmic contact with the uppermost and lowermost layers respectively of said semiconductor body, wherein the uppermost layer in said semiconductor body comprises a main region in contact with said main electrode and an auxiliary region not in contact with said main electrode and electrically isolated from said main region by a groove extending to the adjoining layer of opposite conductivity type, said auxiliary region having a conductor layer disposed exclusively on the surface thereof, a small region of the same conductivity type as that of said uppermost layer being provided between said main region and said auxiliary region at a spot along the boundary therebetween to thereby connect said main region with said auxiliary region, wherein an intermediate region of a conductivity type opposite to that of said adjoining layer and connected with said adjoining layer but isolated from said main and auxiliary regions is provided in said groove at a place remote from said small region and a control electrode is attached to said intermediate region.

2. A multi-layer semiconductor device comprising a semiconductor body including therein four contiguous layers, adjacent ones of said layers having a conductivity type different from each other, and a pair of main electrodes in low ohmic contact with the uppermost and lowermost layers respectively of said semiconductor body, wherein the uppermost layer in said semiconductor body comprises a main region in contact with said main electrode and an auxiliary region not in contact with said main electrode and electrically isolated from said main region by a groove extending to the adjoining layer of opposite conductivity type, said auxiliary region having a conductor layer disposed exclusively on the surface thereof, a small region of the same conductivity type as that of said uppermost layer being provided between said main region and said auxiliary region at a spot along the boundary therebetween to thereby connect said main region with said auxiliary region, wherein said auxiliary region is surrounded by said main region, and an intermediate region of a conductivity type opposite to that of said adjoining layer and connected with said adjoining layer but isolated from said main and auxiliary regions is provided in said groove at a place remote from said small region, and further a control electrode is attached to the surface of said intermediate region.

3. A multi-layer semiconductor device as claimed in claim 2, wherein is provided a second auxiliary region of the same conductivity type as that of said main region, which is electrically isolated from said main region by a groove extending to said adjoining layer and surrounds said main region.

4. A multi-layer semiconductor device comprising:

a semiconductor body having first and second principal surfaces on opposite sides of said body, said body including:

a first semiconductor layer of a first conductivity type, one surface of which corresponds to said first principal surface of said body;

a second semiconductor layer of a second conductivity type, opposite said first conductivity type, disposed in contact with said first semiconductor layer, so as to form a first PN junction therebetween;

a third semiconductor layer of said first conductivity type disposed in contact with said second semiconductor layer, so as to form, therebetween, a second PN junction;

a fourth semiconductor layer of said second conductivity type disposed in contact with said third semiconductor layer, so as to form therebetween a third PN junction, one surface of said fourth layer corresponding to said second principal surface of said body, said fourth semiconductor layer including a main region, having a first prescribed circumferential configuration, disposed in contact with a first portion of said third semiconductor layer, so as to define said third PN junction, and an auxiliary region, having a second prescribed circumferential configuration, disposed in contact with a second portion of said third semiconductor layer and spaced apart from said main region by an isolation region therebetween, said isolation region comprising a groove defining the distance separating the respective opposed peripheries of said main region and said auxiliary region, and means for bridging said main region and said auxiliary region and resistively connecting said opposed peripheries of said main region and said auxiliary region together comprising a resistive region of said second conductivity type formed contiguously to said main region and said auxiliary region at only a relatively narrow spot portion of said groove therebetween, and wherein said auxiliary region has a conductor layer disposed exclusively on the surface thereof;

a first principal electrode in low ohmic contact with said first semiconductor layer at the first principal surface of said body;

a second principal electrode in low ohmic contact with only the main region of said fourth semiconductor layer at the second principal surface of said body; and further including a control electrode disposed within said groove and separated from each of said main and auxiliary regions while being connected to said fourth semiconductor layer.

5. A multi-layer semiconductor device according to claim 4, wherein said control electrode is connected to said third semiconductor layer through a fifth semiconductor region of said second conductivity type disposed in contact with said third semiconductor layer, with said control electrode being disposed in contact with said fifth semiconductor region.

6. A multi-layer semiconductor device comprising:

a semiconductor body having first and second principal surfaces on opposite sides of said body, said body including:

a first semiconductor layer of a first conductivity type, one surface of which corresponds to said first principal surface of said body;

a second semiconductor layer of a second conductivity type, opposite said first conductivity type, disposed in contact with said first semiconductor layer, so as to form a first PN junction therebetween;

a third semiconductor layer of said first conductivity type disposed in contact with said second semiconductor layer, so as to form, therebetween, a second PN junction;

a fourth semiconductor layer of said second conductivity type disposed in contact with said third semiconductor layer, so as to form therebetween a third PN junction, one surface of said fourth layer corresponding to said second principal surface of said body, said fourth semiconductor layer including a main region, having a first prescribed circumferential configuration, disposed in contact with a first portion of said third semiconductor layer, so as to define said third PN junction, and an auxiliary region, having a second prescribed circumferential configuration, disposed in contact with a second portion of said third semiconductor layer and spaced apart from said main region by an isolation region therebetween, said isolation region comprising a groove defining the distance separating the respective opposed peripheries of said main region and said auxiliary region, and means for bridging said main region and said auxiliary region and resistively connecting said opposed peripheries of said main region and said auxiliary region together comprising a resistive region of said second conductivity type formed contiguously to said main region and said auxiliary region at only a portion of said groove therebetween, wherein each of said auxiliary region and said isolation region is arcuate in shape and said auxiliary region is resistively bridged at opposite arcuate ends thereof to said main region;

a first principal electrode in low ohmic contact with said first semiconductor layer at the first principal surface of said body; and a second principal electrode in low ohmic contact with only the main region of said fourth semiconductor layer at the second principal surface of said body.

7. A multi-layer semiconductor device according to claim 6, wherein said auxiliary region is resistively bridged at opposite arcuate ends thereof by a relatively narrow spot portion of a resistive region of said second conductivity type.

* * * * *